Figure 1:
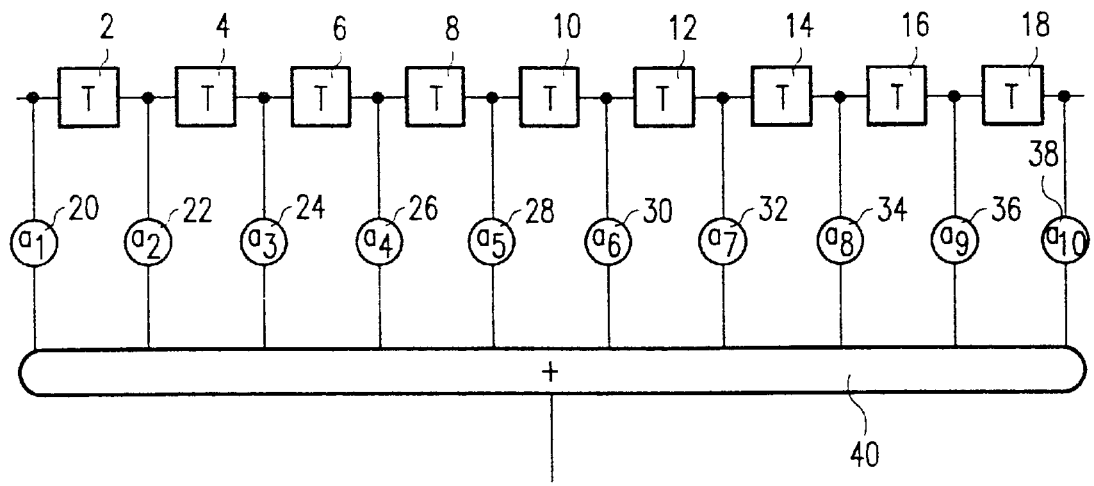

United States Patent [19]
Pelgrom et al.

[11] Patent Number: 5,928,314
[45] Date of Patent: Jul. 27, 1999

[54] DIGITAL FILTER HAVING A SUBSTANTIALLY EQUAL NUMBER OF NEGATIVE AND POSITIVE WEIGHTING FACTORS

[75] Inventors: Marcellinus J. M. Pelgrom; Stefan E. J. Menten, both of Eindhoven, Netherlands

[73] Assignee: U.S. Philips Corporation, New York, N.Y.

[21] Appl. No.: 08/709,454

[22] Filed: Sep. 5, 1996

[30] Foreign Application Priority Data

Sep. 7, 1995 [EP] European Pat. Off. .............. 95202417

[51] Int. Cl.$^6$ ....................................................... G06F 17/10
[52] U.S. Cl. .............................................................. 708/319
[58] Field of Search ........................ 364/724.16, 724.011, 364/724.1

[56] References Cited

U.S. PATENT DOCUMENTS

| | | | |
|---|---|---|---|
| 3,979,701 | 9/1976 | Tomozawa | 364/724.16 |
| 4,862,402 | 8/1989 | Shah et al. | 364/724.12 |
| 5,287,299 | 2/1994 | Lin | 364/759 |
| 5,757,683 | 5/1998 | Deczky | 364/724.16 |

*Primary Examiner*—Tan V. Mai
*Attorney, Agent, or Firm*—Jack D. Slobod

[57] ABSTRACT

In a digital filter in which coefficients are realised using power of two weighting factors, it can occur that due to rounding errors the output signal shows some inaccuracies. By decomposing the filter coefficients into powers of two in such a way that most powers of two have a counterpart with an opposite sign, the rounding errors tend to cancel, resulting in a more accurate filter.

9 Claims, 5 Drawing Sheets

DIGITAL FILTER HAVING A SUBSTANTIALLY EQUAL NUMBER OF NEGATIVE AND POSITIVE WEIGHTING FACTORS

The invention is related to a digital filter comprising means for determining a combination of delayed sample values weighted with filter coefficients, said filter coefficients being decomposed in weighting factors being proportional to a power of two.

Such a digital filter is known from U.S. Pat. No. 5,287,299.

Digital filters are increasingly used in digital signal processing applications such as digital audio and video processing. Digital filters comprise a number of delay elements to obtain delayed signal samples, multipliers for multiplying said delayed signal samples with filter coefficients to obtain weighted signal samples and an adder for adding the weighted signal samples. It is observed that several alternative filter structures exist in which the order of the delay operation, the multiplication with the filter coefficients and the addition is changed.

Digital filters can be recursive or non-recursive. In a non-recursive filter the output signal is proportional to a linear combination of delayed input samples. The impulse response of such a non-recursive filter has always a finite duration. Therefore these filters are often called FIR (Finite Impulse Response) filters. In a recursive filter the output signal is proportional to a linear combination of delayed input samples and delayed output samples.

The multipliers for obtaining the weighted signal samples are the most complex elements of a digital filter. If a digital filter function is implemented in a programmable processor the multiplications to be executed for obtaining the weighted signal samples consume most of the processing power needed to implement the filter function.

In the digital, filter known from the above mentioned U.S. patent the filter coefficients are decomposed in a plurality of weighting factors each having a value being a power of two. Using such decomposition, the multiplications can be replaced by a number of shift and add operations. The reason for this is that multiplication of a number in binary representation by a power of two can be performed by a shift operation on said number.

To limit the complexity of the filter, the result of the multiplication operation is rounded or truncated to a limited number of bits. This can lead to inaccuracies, in particular if weighting factors occur with an exponent having a small negative value. Said inaccuracies are influenced by the chosen decompensation of the filter coefficients.

The object of the present invention is to provide a digital filter according to the preamble in which the inaccuracies caused by rounding or truncation are reduced.

Therefor the invention is characterized in that the number of weighting factors with a predetermined power of two and having opposite signs is substantially equal.

By having the numbers of positive coefficients with a given power of two substantially equal to the numbers of negative coefficients with the same power of two, the truncation or rounding errors associated with said coefficients tend to compensate.

In a prior art filter the rounding or truncation errors can lead to a toggling of the least significant bit if a slowly varying signal is applied at the input. Said effect is in particular visible when the input signal is a slow ramp signal. In the digital filter according to the invention this effect is substantially reduced.

An embodiment of the invention is characterized in that the digital filter comprises interconnection means for obtaining the weighting of the delayed samples with a weighting factor.

When the filter is implemented in hardware, an easy way to realize the shift operation is to choose a suitable interconnection between delay means to be used for obtaining the delayed samples and the adding means for obtaining the combination of weighted delayed input samples. If the delayed input samples are represented by 8 bits $a_7, a_6, \ldots, a_1, a_0$, multiplication by a factor of 0.5 can be obtained by connecting bit $a_7$ of a given delayed input sample to bit $a_6$ of the adder, $a_6$ of the delayed input sample to bit $a_5$ of the adder etc. No additional hardware is necessary to obtain the weighted delayed samples.

A further embodiment of the invention is characterized in that the interconnection means comprise for at least one delayed input sample an interconnection matrix to provide weighting of said sample with all power of two weighting factors associated with it.

If a filter coefficient is decomposed in a plurality of weighting factors being a power of two, additional adding means are required to add the increased number of weighted delayed input samples. By realising the weighting of the delayed samples by means of an interconnection matrix for all power of two coefficients associated to a given sample, it is possible to realise a filter according to the invention without needing additional adders.

Figure 2:
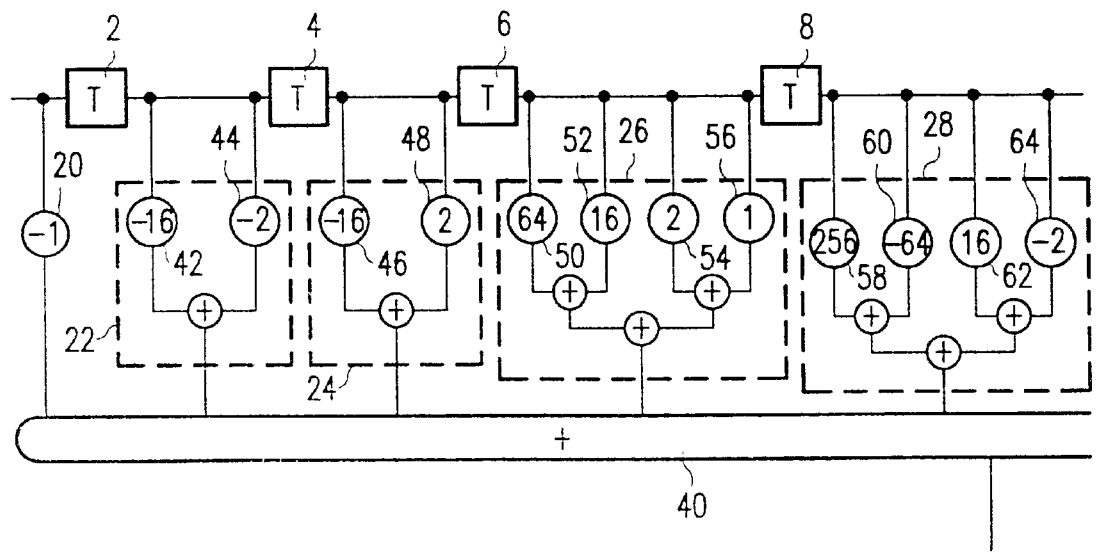
Figure 3:
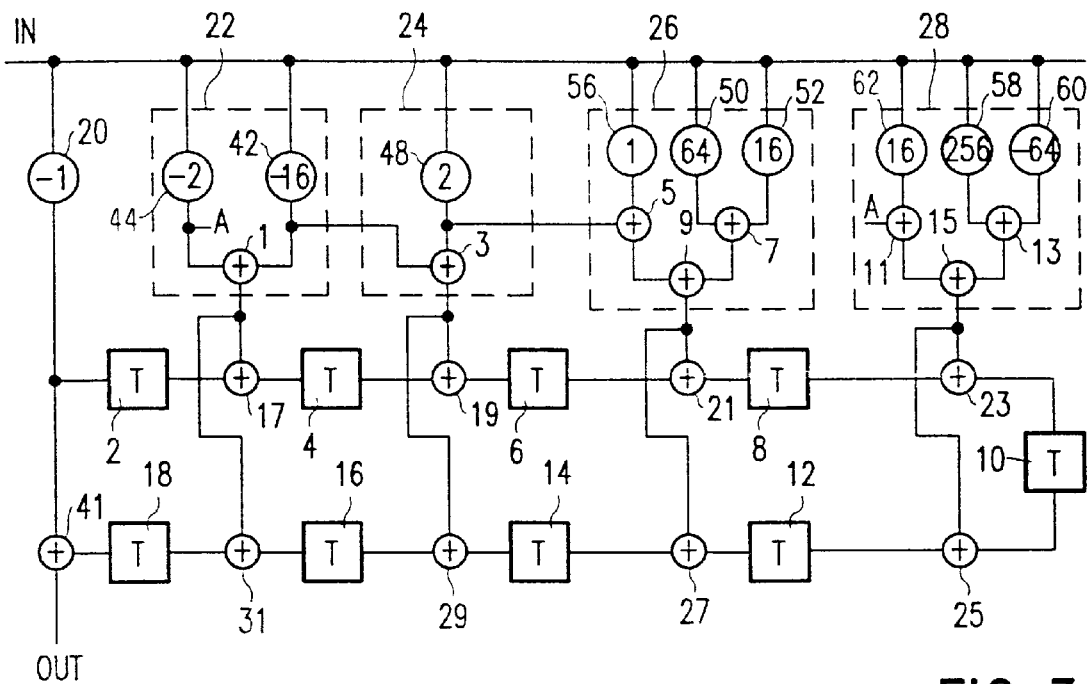
Figure 4:
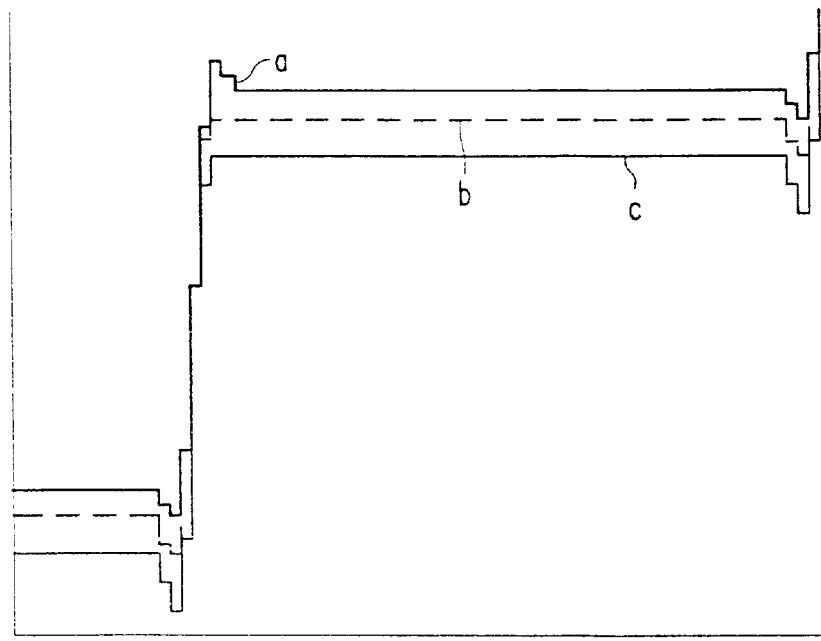
Figure 5:
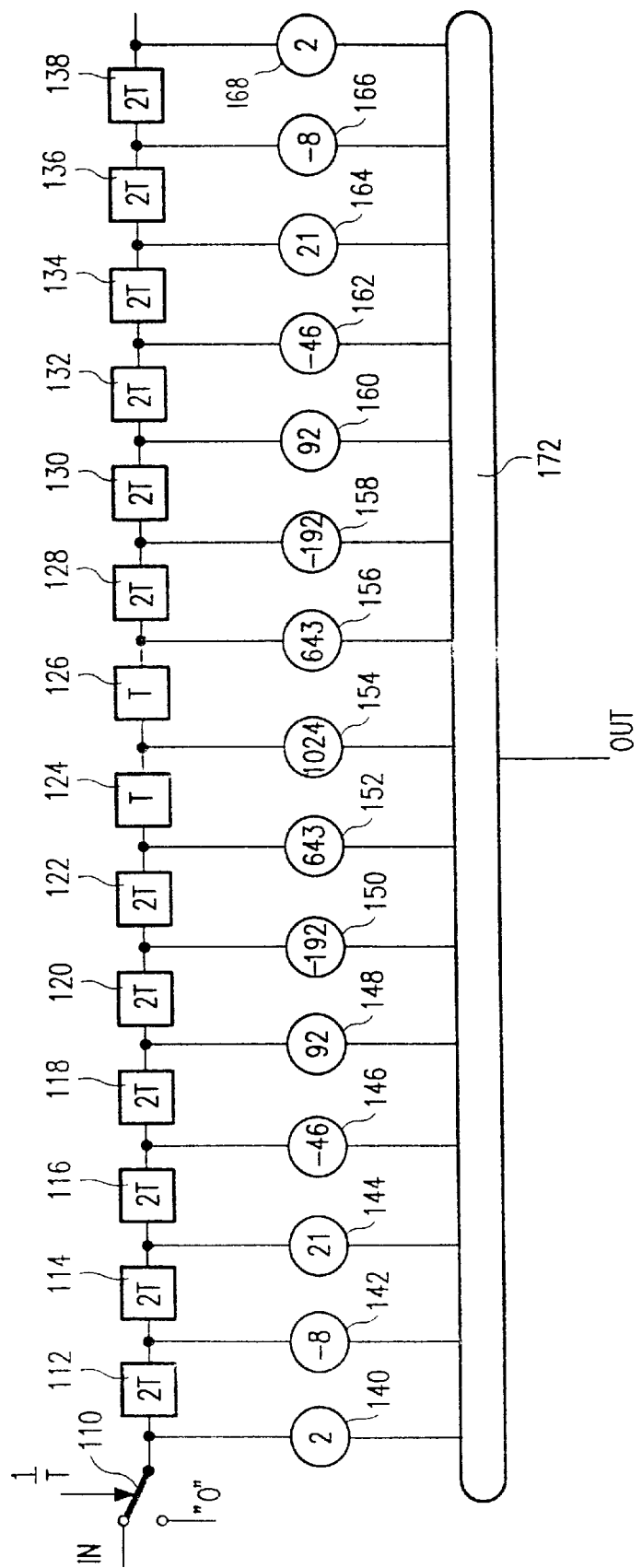
Figure 6:
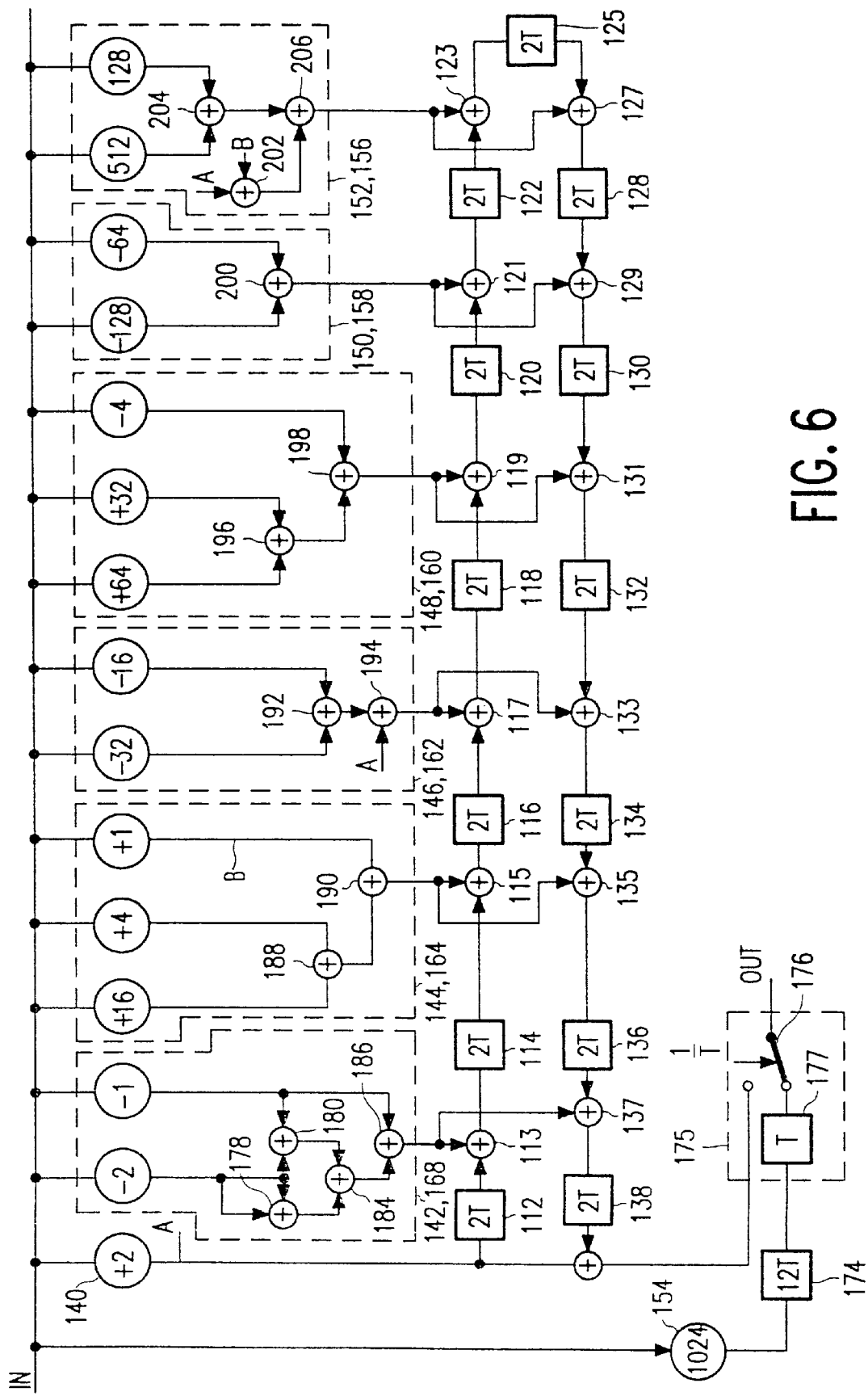
Figure 7:
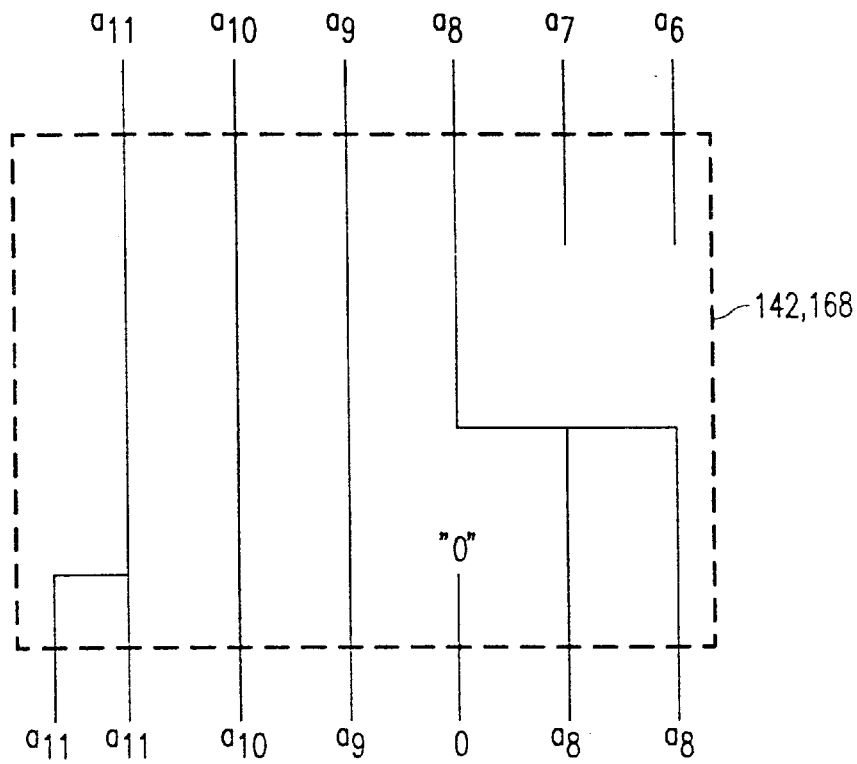
Figure 8:
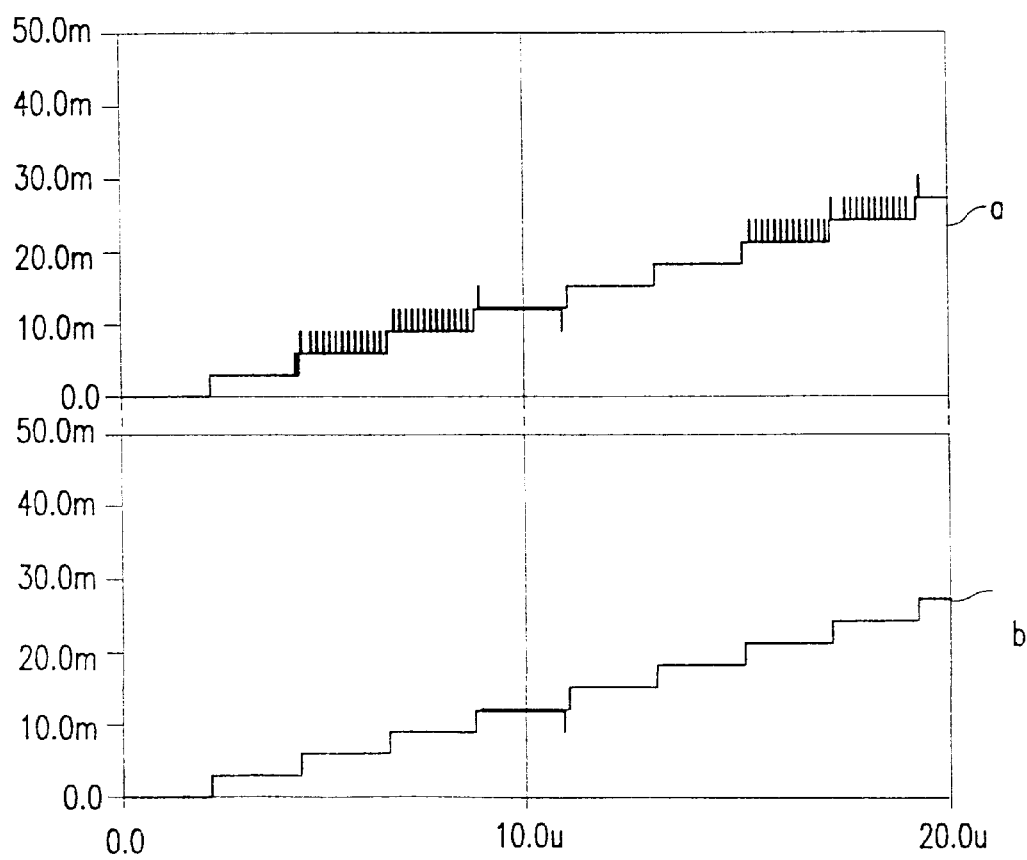

The invention will now be explained referring to the drawings. Herein shows:

FIG. 1, a transversal digital low pass filter according to the prior art;

FIG. 2, the filter according to FIG. 1 modified according to the present invention;

FIG. 3, a second embodiment of said filter according to the invention;

FIG. 4, a graph showing the response to a slow ramp of an ideal filter, a prior art filter according to FIG. 1 and the filter according to the invention according to FIG. 2;

FIG. 5, an interpolating half band filter according to the prior art;

FIG. 6, an implementation according to the invention of the filter according to FIG. 5;

FIG. 7, an embodiment of the weighting means 142,168 in the filter according to FIG. 6;

FIG. 8, graphs of the response to a slow ramp of a prior art interpolating filter according to FIG. 5 and the filter according to FIG. 6.

In the low pass filter according to FIG. 1, the input signal is applied to a sequence of delay elements 2, 4, 6, 8, 10, 12, 14, 16 and 18. The input of the delay element 2 and the outputs of delay elements 2, 4, 6, 8, 10, 12, 14, 16 and 18 are connected to weighting means 20, 22, 24, 26, 28, 30, 32, 34, 36, and 38. The outputs of the weighting means 20 . . . 38 are connected to corresponding inputs of an adder 40. The output of the adder 40 constitutes the output of the digital filter.

The filter according to FIG. 1 is a low pass filter having a cut-off frequency of 1/5T, in which T is the delay of the delay elements 2, 4, 6, 8, 10, 12, 14, 16 and 18. The coefficients of the filter have been chosen to be symmetrical, this means that the first coefficient is equal to the last coefficient, the second coefficient is equal to the last coefficient by one etc. The coefficients of the filter according to FIG. 1 have been chosen to be symmetrical to obtain linear phase properties. This means that the phase shift of the filter is proportional to the frequency of the input signal, resulting in a constant group delay. To reduce the complexity of the filter, the coefficients are constituted by a combination of weighting factors being a power of two. In the table below the coefficients of the filter according to FIG. 1 are presented together with their decomposition in weighting factors being a power of two according to the prior art.

| Coefficient | Value | Decomposition in powers of 2 |
|---|---|---|
| $a_1$ | −1 | −1 |
| $a_2$ | −18 | −16 −2 |
| $a_3$ | −14 | −16 +2 |
| $a_4$ | 83 | +64 +16 +2 +1 |
| $a_5$ | 206 | +128 +64 +16 −2 |
| $a_6$ | 206 | +128 +64 +16 −2 |
| $a_7$ | 83 | +64 +16 +2 +1 |
| $a_8$ | −14 | −16 +2 |
| $a_9$ | −18 | −16 +2 |
| $a_{10}$ | −1 | −1 |

In a hardware implementation the adder 40 is often implemented as a cascade of two-input adders.

FIG. 2 shows the filter according to FIG. 1 in which the invention is applied. Only one halve of the filter is drawn due to the symmetry present in the filter. The other halve of the filter according to FIG. 2 is equal to the half shown in FIG. 2. The decompensation of the coefficients in powers of two is shown by displaying the content of the weighting means 22, 24, 26 and 28.

According to the invention the number of positive weighting factors with a given power of two and the number of negative weighting factors with the same power of two is substantially equal. In the table below the weighting factors with the same power of two but having different signs are presented in the same column.

| Weighting factor No. | Value | Weighting factor No. | Value |
|---|---|---|---|
| 20 | −1 | 56 | +1 |
| 42 | −16 | 52 | +16 |
| 44 | −2 | 48 | +2 |
| 46 | −16 | 62 | +16 |
| 50 | +64 | 60 | −64 |
| 54 | +2 | 64 | −2 |
| 58 | 256 | — | — |

From the table it can be seen that all weighting factors, except weighting factor 58 with value 256, have a counterpart with different sign. This means that substantially all weighting factors have a counterpart with a different sign. In general there may be a small amount of weighting factors having no counterpart with different sign. In the filter according to FIG. 2 each halve has a weighting factor with value 256 having no counterpart with different sign.

FIG. 3 shows an alternative embodiment of the filter according to FIG. 2. In the embodiment according to FIG. 3 the reversed addition technique in combination with the folded structure is used. In the reversed addition technique, the input signal is weighted with the different weighting factors. The weighted input samples are added one by one to an output signal of a delay element. The weighted signal samples are obtained by adding the input samples weighted with the weighting factors by one or more adders.

The input samples weighted with coefficient value −18 (weighting means 22) is obtained by adding the input samples weighted with a weighting factor −16 and the input samples weighted with a weighting factor −2. In a similar way the weighting with coefficients +14 (weighting means 24) +83 (weighting means 26) and 206 (weighting means 28) are realised. The weighted input samples are added to the output signal of a corresponding delay element. The weighted input samples are used twice due to the symmetry of the impulse response of the filter. The advance of using the reversed addition technique is that the adders between the delay elements have a time T available for calculating their result. In the filter according to FIG. 1 the adder has to perform all additions in the same time T.

FIG. 4 shows the response of an ideal filter, a filter according to the prior art, and a filter according to the present invention to a slow ramp signal. Graph a shows the response of an ideal filter with the coefficients according to FIG. 1, graph b shows the response of a filter according to the invention, and graph c shows the response of a filter according to the prior art. From FIG. 4 it is clear that the response of the filter according to the invention matches the response of the ideal filter more accurately than the filter according to the prior art.

In the digital filter according to FIG. 5 an input signal is applied to a sample rate converter 110. The sample rate converter 110 increases the sample rate with a factor of two. This increase is obtained by inserting zero values between the input samples. The input signal has a sampling rate 1/2T and the output signal of the sampling rate converter 110 has a sampling rate of 1/T. The output of the sample rate converter 110 is connected to an interpolating filter comprising of delay elements 112 . . . 138, multipliers 140 . . . 168 and an adder 172. All delay elements have a delay value of 2T, except the delay elements 124 and 126 which have a delay value of T. The interpolating filter is a so-called half band filter. The transfer function of a half band filter is symmetrical around the coordinates ($f_s/2$, $H(f_s/2)$), in which $f_s$ is 1/T. This symmetry results in a value of zero for the even filter coefficients except one center coefficient. This is the reason that the majority of the delay elements have a delay value of 2T. The delay elements 124 and 126 have a delay value of T, because the center coefficient has a non-zero value.

FIG. 6 shows an alternative embodiment of the filter according to FIG. 5. In the filter according to FIG. 6 the reverse addition technique, in combination with the folded structure is used for the same reason it was used in the filter according to FIG. 3. The filter coefficients 142 . . . 168 are realised by a plurality of additions of input samples weighted with a weighting factor being a power of two. The decomposition of the filter coefficients in weighting factors which are added is done in such a way that the criteria according to the invention are met. Said decomposition is presented in the table below.

| Coefficient | Value | Decomposition |
|---|---|---|
| 140 | 2 | +2 |
| 142 | −8 | −2 −2 −2 −1 −1 |
| 144 | 21 | +16 +4 +1 |
| 146 | −46 | −32 −16 +2 |
| 148 | 92 | +64 +32 −4 |
| 150 | −192 | −128 −64 |
| 152 | 643 | +512 +128 +1 +2 |
| 154 | 1024 | 1024 |
| 156 | 643 | +512 +128 +1 +2 |
| 158 | −192 | −128 −64 |
| 160 | 92 | +64 +32 −4 |
| 162 | −46 | −32 −16 +2 |
| 164 | 21 | +16 +4 +1 |
| 166 | −8 | −2 −2 −2 −1 −1 |
| 168 | 2 | +2 |

From the table it can be seen that, except for the weighting factor with value 1024, there exists for every weighting factor having a predetermined absolute value a counterpart having the same absolute value but a different sign.

To reduce the required computational speed in the filter according to FIG. 6, the so-called poly phase decomposition is applied. This means in the filter according to FIG. 6 that the even output samples and the odd output samples of the filter are derived using separate filter branches. Both filter branches have to process their data at a speed of only 1/2T samples/sec. The filter branch for deriving the even output samples comprises the folded structure with delay elements 112, 114, . . . , 136 and 138, and the weighting means 142, 168, 144, 164, 146, 162, 148, 160, 150, 158 152 and 156. The filter branch for deriving the odd output samples comprises the weighting means 154 and the delay element 174, having a delay of 12T. The output signal of the filter according to FIG. 6 is obtained by switching between the even and odd samples by means of the switch 176. It is observed that the switch 176 is combined with a delay element 177 to obtain the sample rate converter 175. The delay element 177 causes in combination with the delay element 174 a total delay of 13T.

From FIG. 6, it can be seen that the weighting means 142, 168 comprise four adders 178, 180, 184 and 186. The complexity of said weighting means can be substantially decreased by using the implementation according to FIG. 7. In the implementation of the weighting means 142, 168 it is assumed that the input signal is presented in two's complement. To realise a negative weighting factor, instead of the input signal the complemented input signal is used.

If it is assumed that the value of the input sample weighted with filter coefficient 142 is represented by 7 bits, and that also is assumed that the maximum value to be represented by said 7 bits is equal to 16 times the input signal $V_{in}$, it can be written by denoting the 7 bits $a_{11} \ldots a_7$.

| | | | | | | | | |
|---|---|---|---|---|---|---|---|---|
| $16 \cdot V_{in}$: | $a_{11}$ | $a_{10}$ | $a_9$ | $a_8$ | $a_7$ | $a_6$ | $a_7$ | (1) |
| $2 \cdot V_{in}$: | $a_{11}$ | $a_{11}$ | $a_{11}$ | $a_{11}$ | $a_{10}$ | $a_9$ | $a_8$ | (2) |
| $1 \cdot V_{in}$: | $a_{11}$ | $a_{11}$ | $a_{11}$ | $a_{11}$ | $a_{11}$ | $a_{10}$ | $a_9$ | (3) |

By adding $(2 \cdot V_{in} + 2 \cdot V_{in}) + (V_{in} + V_{in} + 2 \cdot V_{in})$ for $8 \cdot V_{in}$ is found:

| | | | | | | | | |
|---|---|---|---|---|---|---|---|---|
| $8 \cdot V_{in}$: | $a_{11}$ | $a_{11}$ | $a_{10}$ | $a_9$ | 0 | $a_8$ | $a_8$ | (4) |

From (4) it is clear that the value $8 \cdot V_{in}$ can easily be obtained by an interconnection matrix according to FIG. 7.

In graph a of FIG. 8 the response of a prior art half band filter according to FIG. 5 to slow ramp signal is displayed. It can be seen that toggling of the output signal around certain value occurs. In graph b of FIG. 8, the response of a half band filter according to the invention is displayed. It can be clearly seen from graph b that the toggling of the output signal is substantially reduced.

We claim:

1. Digital filter comprising means for determining a combination of delayed sample values weighted with filter coefficients, said filter coefficients being decomposed into weighting factors being proportional to a power of two, characterized in that the number of weighting factors with a predetermined power of two and having opposite signs is substantially equal.

2. Digital filter according to claim 1, characterized in that the digital filter comprises interconnection means for obtaining the weighting of the delayed sample values with a weighting factor.

3. Digital filter according to claim 2 characterized in that the interconnection means comprise for at least one delayed sample value an interconnection matrix to provide weighting of said sample value with all power of two weighting factors associated with said sample value.

4. Digital filter comprising means for determining a combination of sample values weighted with filter coefficients, said filter coefficients being decomposed into weighting factors being proportional to a power of two, characterized in that the number of weighting factors with a predetermined power of two and having opposite signs is substantially equal.

5. Digital filter according to claim 4, characterized in that the digital filter comprises interconnection means for obtaining the weighting of the sample values with a weighting factor.

6. Digital filter according to claim 5 characterized in that the interconnection means comprise for at least one sample value an interconnection matrix to provide weighting of said sample value with all power of two weighting factors associated with said sample value.

7. Digital filter according to claim 4 wherein all of the sample values except one sample value have been delayed with respect to said one sample value.

8. Digital filter according to claim 7, characterized in that the digital filter comprises interconnection means for obtaining the weighting of the sample values with a weighting factor.

9. Digital filter according to claim 8 characterized in that the interconnection means comprise for at least one sample value an interconnection matrix to provide weighting of said sample value with all power of two weighting factors associated with said sample value.

\* \* \* \* \*